(12) United States Patent

He et al.

(10) Patent No.: US 12,622,097 B2

(45) Date of Patent: May 5, 2026

(54) MICRO LIGHT-EMITTING DIODE STRUCTURE

(71) Applicant: RAYLEIGH VISION LIMITED, Kowloon (HK)

(72) Inventors: Jr-Hau He, Hsinchu City (TW); Zhi-Ting Ye, Miaoli County (TW); Chun-Wei Tsai, New Taipei City (TW); Yuk-Tong Cheng, Kowloon (HK)

(73) Assignee: RAYLEIGH VISION INTELLIGENCE CO. LTD., Hsinchu City (TW)

( * ) Notice: Subject to any disclaimer, the term of this patent is extended or adjusted under 35 U.S.C. 154(b) by 352 days.

(21) Appl. No.: 18/201,307

(22) Filed: May 24, 2023

(65) Prior Publication Data

US 2024/0395967 A1        Nov. 28, 2024

(51) Int. Cl.

| | |
|---|---|
| *H01L 33/08* | (2010.01) |
| *H01L 33/00* | (2010.01) |
| *H10H 20/813* | (2025.01) |
| *H10H 20/825* | (2025.01) |
| *H10H 20/857* | (2025.01) |

(52) U.S. Cl.

CPC ........ *H10H 20/813* (2025.01); *H10H 20/825* (2025.01); *H10H 20/857* (2025.01)

(58) Field of Classification Search

CPC .. H10H 20/813; H10H 20/825; H10H 20/857; H10H 20/831; H10H 20/84; H10H 20/824; H01L 25/0756; H01L 25/075; H01L 25/18; H01L 25/167; H01L 25/0753; H10W 90/00

See application file for complete search history.

(56) References Cited

U.S. PATENT DOCUMENTS

| | | | |
|---|---|---|---|
| 11,967,589 B2 * | 4/2024 | Xu | H01L 24/32 |
| 12,211,957 B2 * | 1/2025 | Xiong | H10H 20/841 |
| 2015/0144928 A1 * | 5/2015 | Forrest | H10K 50/858 257/40 |
| 2021/0384182 A1 * | 12/2021 | Xu | H10H 20/855 |
| 2022/0140203 A1 * | 5/2022 | Xiong | H10H 20/833 257/98 |

* cited by examiner

*Primary Examiner* — Nikolay K Yushin

(74) *Attorney, Agent, or Firm* — WPAT, PC

(57) ABSTRACT

The present invention provides a micro light-emitting diode structure, which comprises: a first light-emitting layer, a second light-emitting layer, a third light-emitting layer, a first dielectric layer, a second dielectric layer, and a third dielectric layer stacked on one another sequentially. The first light-emitting layer, the second light-emitting layer, and the third light-emitting layer are connected electrically by fan-out circuit layers, respectively. A first area of the first dielectric layer is greater than a second area of the second dielectric layer. The second area is greater than a third area of the third dielectric layer. A first refractive index of the first dielectric layer is smaller than a second refractive index of the second dielectric layer. The second refractive index is smaller than a third refractive index of the third dielectric layer. By using this structure, the light-emitting angle of a micro LED can be further shrunk.

10 Claims, 6 Drawing Sheets

MICRO LIGHT-EMITTING DIODE STRUCTURE

BACKGROUND OF THE INVENTION

The micro light-emitting diode (micro LED) is a novel display technology formed by miniature light-emitting chips. In comparison to the LED or organic LED (OLED) display technology according to the prior art, micro LEDs own higher brightness, contrast, and color expressiveness as well as greater performance and longer lifetime.

Compared with the display technologies according to the prior art, micro LEDs own many advantages including primarily the brightness and contrast. The brightness of a micro LED can reach ten times the brightness of a general OLED. The contrast of a micro LED is also higher. These advantages make micro LED displays are apparently superior in color reproduction and image quality.

The advantage of micro LEDs is their color expressiveness. Since micro LED displays adopt pure light sources, they can display a broader color gamut and hence providing truer and more vivid colors. In addition, micro LED displays also provide local brightness adjustment. This means that they can adjust brightness in different regions of a display independently and thus achieving superior contrast and performance.

The third advantage is greater performance and longer lifetime. In addition, micro LED use pure light sources. Thereby, no backlight and color filter layer is required, which enhances the light-emitting efficiency.

Owing to the advantages of micro LEDs, they have become the primary choice for high-end display products, including smartphones, tablet computers, televisions, VR/AR helmets, and automotive displays.

As consumers' requests for higher quality and resolution, the micro LED technology has attracted more attention. Compared to LCD displays, LED displays, and OLED displays, micro LED display have higher brightness and better contrast. Besides, they also have broader color gamut. Consequently, micro LED displays have been regarded as an important development direction for next-generation display technologies.

Furthermore, the advantages of micro LEDs also include reliability and long-term costs. Thanks to their longer lifetime and durability, compared to other technologies, micro LEDs are more economical. In addition, due to their low power consumption and long lifetime, this technology can maintain high-quality displays for a long time without excessive maintenance or replacement of parts.

Unfortunately, owing its miniature size, the micro LED according to the prior art cannot install a light-concentrating device on the light-emitting surface like the prior art, making micro LEDs difficult in shrinking the light-emitting angle and leading to inconsistent brightness. Moreover, when the dies of the micro LEDs according to the prior art emit light, the light-emitting angle is too wide, resulting in light mixing and inaccurate colors. Accordingly, it is urged to have a micro LED structure capable shrinking the light-emitting angle effectively.

To solve the above problem according to the prior art, the present invention provides a micro LED structure, which uses a plurality of dielectric layers with gradually shrinking widths from the bottom up. By adopting a plurality of light-emitting layers with fan-out packaging, the light emitting by the plurality of light-emitting layers can be concentrated and thus shrinking the light-emitting angle of the micro LED structure.

SUMMARY OF THE INVENTION

An objective of the present invention is to provide a micro LED structure, which disposes a plurality of dielectric layer with gradually shrinking widths from the bottom up on a plurality of light-emitting layers with fan-out packaging so that the light emitted by the plurality of light-emitting layers can be concentrated an thus shrinking the light-emitting angle of the micro LED structure.

To achieve the above objective and efficacy, the present invention provides a micro LED structure, which comprises: a first light-emitting layer, a second light-emitting layer, a third light-emitting layer, a first dielectric layer, a second dielectric layer, and a third dielectric layer. The second light-emitting layer is disposed on the first light-emitting layer. A first fan-out circuit layer is disposed below the second light-emitting layer and connected electrically to the first light-emitting layer and the second light-emitting layer. The third light-emitting layer is disposed on the second light-emitting layer. A second fan-out circuit layer is disposed below the third light-emitting layer and connected electrically to the second light-emitting layer and the third light-emitting layer. The first dielectric layer is disposed on the third light-emitting layer. The second dielectric layer is disposed on the first dielectric layer. The third dielectric layer is disposed on the second dielectric layer. A first area of the first dielectric layer is greater than a second area of the second dielectric layer. The second area is greater than a third area of the third dielectric layer. A first refractive index of the first dielectric layer is smaller than a second refractive index of the second dielectric layer. The second refractive index is smaller than a third refractive index of the third dielectric layer. By using this structure, the light-emitting angle of a micro LED can be further shrunk.

To achieve the above objective and efficacy, the present invention provides a micro LED structure, which comprises: a first light-emitting layer, a second light-emitting layer, a third light-emitting layer, a first dielectric layer, a second dielectric layer, and a third dielectric layer. The second light-emitting layer is disposed on the first light-emitting layer. A first fan-out circuit layer is disposed below the second light-emitting layer and connected electrically to the first light-emitting layer and the second light-emitting layer. The third light-emitting layer is disposed on the second light-emitting layer. A second fan-out circuit layer is disposed below the third light-emitting layer and connected electrically to the second light-emitting layer and the third light-emitting layer. The first dielectric layer is disposed on the third light-emitting layer. The second dielectric layer is disposed on the first dielectric layer. The third dielectric layer is disposed on the second dielectric layer. A first area of the first dielectric layer is smaller than a second area of the second dielectric layer. The second area is smaller than a third area of the third dielectric layer. A first refractive index of the first dielectric layer is greater than a second refractive index of the second dielectric layer. The second refractive index is greater than a third refractive index of the third dielectric layer. By using this structure, the light-emitting angle of a micro LED can be further shrunk.

According to an embodiment of the present invention, the micro LED structure further comprises a substrate. The first light-emitting layer is disposed on the substrate. A third fan-out circuit layer is disposed below the first light-emitting layer. The third fan-out circuit layer is connected electrically to the first light-emitting layer and the substrate.

According to an embodiment of the present invention, the material of the substrate is selected from the group consisting of gallium nitride, gallium arsenide, gallium phosphide, indium phosphide, silicon carbide, and aluminum oxide.

According to an embodiment of the present invention, the first dielectric layer is a grid index layer.

According to an embodiment of the present invention, the first dielectric layer, the second dielectric layer, and the third dielectric layer are formed by the reactive-ion etching (RIE).

According to an embodiment of the present invention, the first dielectric layer, the second dielectric layer, and the third dielectric layer are translucent correspondingly; the first light-emitting layer, the second light-emitting layer, and the third light-emitting layer are translucent correspondingly.

According to an embodiment of the present invention, the material of the first light-emitting layer, the second light-emitting layer, and the third light-emitting layer is selected from the group consisting of gallium nitride, aluminum indium gallium phosphide, aluminum gallium arsenide, and aluminum gallium phosphide.

According to an embodiment of the present invention, the first light-emitting layer, the second light-emitting layer, and the third light-emitting layer include an n-type semiconductor, a p-type semiconductor, and a light-emitting layer, respectively.

According to an embodiment of the present invention, the energy bandgap of the first light-emitting layer is greater than the energy bandgap of the second light-emitting layer; the energy bandgap of the second light-emitting layer is greater than the energy bandgap of the third light-emitting layer.

According to an embodiment of the present invention, the energy bandgap of the first light-emitting layer is smaller than the energy bandgap of the second light-emitting layer; the energy bandgap of the second light-emitting layer is smaller than the energy bandgap of the third light-emitting layer.

DETAILED DESCRIPTION OF THE INVENTION

In order to make the structure and characteristics as well as the effectiveness of the present invention to be further understood and recognized, the detailed description of the present invention is provided as follows along with embodiments and accompanying figures.

To solve the above problem according to the prior art, the present invention provides a micro LED structure, in which a plurality of light-emitting layers are connected electrically in fan-out packaging. A plurality of dielectric layers are disposed on the plurality of light-emitting layers. The area of each of the plurality of dielectric layers is smaller than the area of the dielectric layer below, respectively. Thereby, the light emitted by the plurality of light-emitting layers can be concentrated and thus shrinking the light-emitting angle of the micro LED structure. Consequently, the problems of inconsistent brightness and inaccurate color due to mixing of light from respective diode dies according to the prior art can be solved.

Figure 1:
FIG. 1 shows a schematic diagram of the structure according to an embodiment of the present invention.
Figure 1:
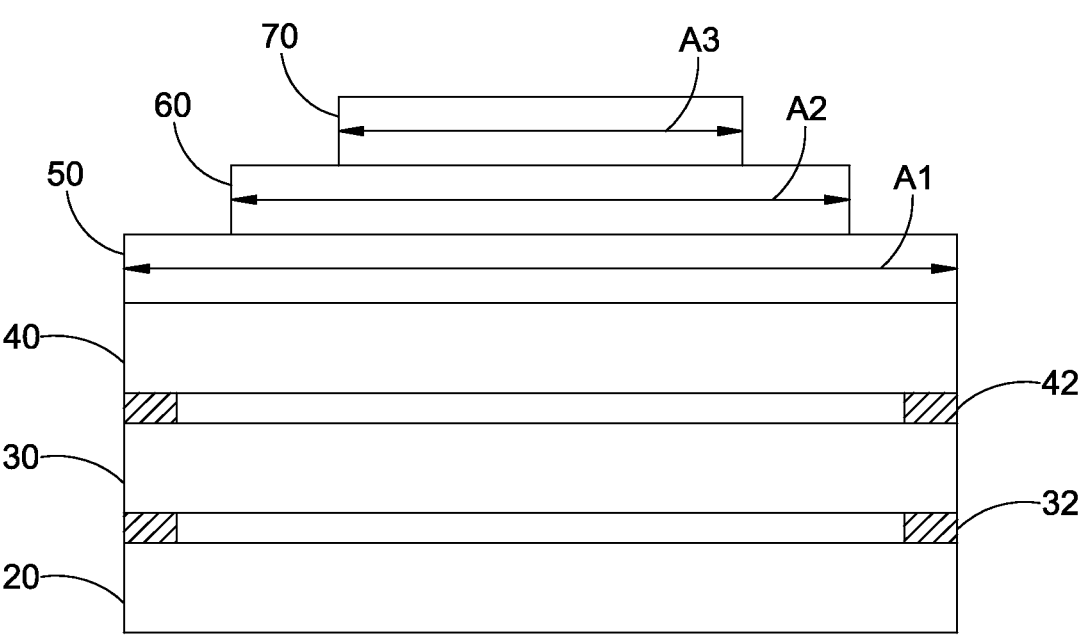

Please refer to FIG. 1, which shows a schematic diagram of the structure according to an embodiment of the present invention. As shown in the figure, according to the present embodiment, a micro LED structure 1 comprises a first light-emitting layer 20, a second light-emitting layer 30, a third light-emitting layer 40, a first dielectric layer 50, a second dielectric layer 60, and a third dielectric layer 70. The layers are stacked on one another.

Figure 2:
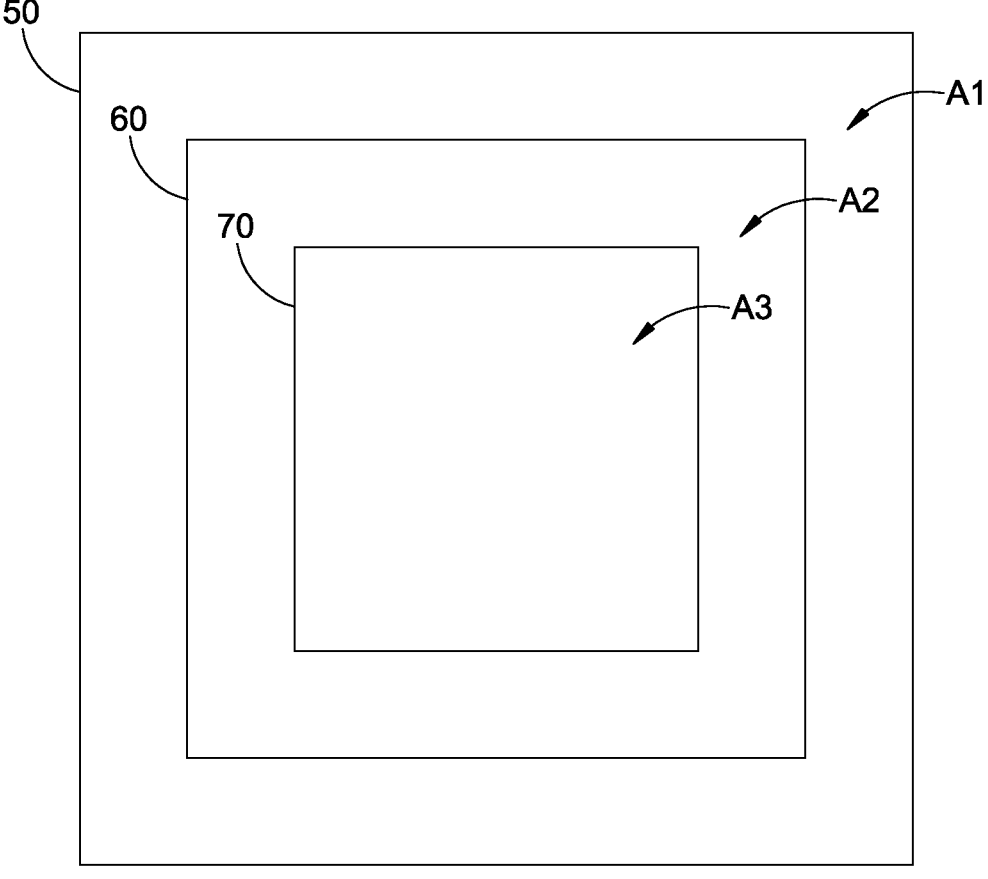
FIG. 2 shows a top view according to an embodiment of the present invention.

Please refer to FIG. 1 again and to FIG. 2, which shows a top view according to an embodiment of the present invention. According to the present embodiment, the second light-emitting layer 30 is disposed on the first light-emitting layer 20. A first fan-out circuit layer 32 is disposed below the second light-emitting layer 30 and connected electrically to the first light-emitting layer 20 and the second light-emitting layer 30. The third light-emitting layer 40 is disposed on the second light-emitting layer 30. A second fan-out circuit layer 42 is disposed below the third light-emitting layer 40 and connected electrically to the second light-emitting layer 30 and the third light-emitting layer 40. The first dielectric layer 50 is disposed on the third light-emitting layer 40. The second dielectric layer 60 is disposed on the first dielectric layer 50. The third dielectric layer 70 is disposed on the second dielectric layer 60.

According to the present embodiment, the first dielectric layer 50 includes a first area A1; the second dielectric layer 60 includes a second area A2; the third dielectric layer 70 includes a third area A3. The first area A1 of the first dielectric layer 50 is greater than the second area A2 of the second dielectric layer 60. The second area A2 of the second dielectric layer 60 is greater than the third area A3 of the third dielectric layer 70. Thereby, the first dielectric layer 50, the second dielectric layer 60, and the third dielectric layer 70 form a trapezoidal or fan structure for focusing the light emitted from the first light-emitting layer 20, the second light-emitting layer 30, and the third light-emitting layer 40 and shrinking the light-emitting angle.

According to the present embodiment, the first area A1 of the first dielectric layer 50 is identical to the areas of the first light-emitting layer 20, the second light-emitting layer 30, and the third light-emitting layer 40 for avoiding light dispersion from the first light-emitting layer 20, the second light-emitting layer 30, and the third light-emitting layer 40 and affecting the light-emitting quality.

According to the present embodiment, the first dielectric layer 50, the second dielectric layer 60, and the third dielectric layer 70 are translucent layers. They allow light transmission so that the light emitted from the first light-emitting layer 20, the second light-emitting layer 30, and the third light-emitting layer 40 can pass through.

According to the present embodiment, the light from the first light-emitting layer 20, the second light-emitting layer 30, and the third light-emitting layer 40 passes through the translucent layers. The first light-emitting layer 20, the second light-emitting layer 30, and the third light-emitting layer 40 are pervious to light correspondingly so that the light emitted from the first light-emitting layer 20, the second light-emitting layer 30, and the third light-emitting layer 40 can pass through.

According to an embodiment, the energy bandgap of the first light-emitting layer 20 is greater than the energy bandgap of the second light-emitting layer 30; the energy bandgap of the second light-emitting layer 30 is greater than the energy bandgap of the third light-emitting layer 40. Nonetheless, the present invention is not limited to the embodiment.

According to an embodiment, the energy bandgap of the first light-emitting layer 20 is smaller than the energy bandgap of the second light-emitting layer 30; the energy bandgap of the second light-emitting layer 30 is smaller than the energy bandgap of the third light-emitting layer 40. Nonetheless, the present invention is not limited to the embodiment.

According to the present embodiment, the first fan-out circuit layer 32 of the second light-emitting layer 30 and the second fan-out circuit layer 42 of the third light-emitting layer 40 are formed by fan-out packaging. The significant feature of fan-out packaging is to make the redistribution layer broader and enable more pin count. Thereby, more functions can be integrated in a single chip and achieving substrate packaging, thinness, and low costs.

According to an embodiment, an air layer or an isolation layer can be disposed between the electrodes of the first fan-out circuit layer 32. Likewise, an air layer or an isolation layer can be disposed between the electrodes of the second fan-out circuit layer 42. Nonetheless, the present invention is not limited to the embodiment.

According to the present embodiment, a first refractive index of the first dielectric layer 50 is smaller than a second refractive index of the second dielectric layer 60. The second refractive index of the second dielectric layer 60 is smaller than a third refractive index of the third dielectric layer 70. Thereby, the light from the first light-emitting layer 20, the second light-emitting layer 30, and the third light-emitting layer 40 can be concentrated to the light-emitting surface of the third dielectric layer 70 and avoiding different light-emitting angles of the first light-emitting layer 20, the second light-emitting layer 30, and the third light-emitting layer 40.

The refractive index is a physical quantity used for describing the deflection of light when it enters another medium from one medium. To be concrete, the refractive index is a ratio of the speed of light in a medium to the speed of light in vacuum. When the light enters another medium from one medium, it will change the speed and the direction owing to the difference in the density of medium. If the refractive index of a medium is higher, the speed of light in the medium is slower and the light will deflect toward the normal. Contrarily, for a medium with a lower refraction index, the speed of light in the medium is faster and the light will deflect away from the normal.

According to an embodiment, the first light-emitting layer 20, the second light-emitting layer 30, and the third light-emitting layer 40 emit one of the red, green, and blue light. Nonetheless, the present invention is not limited to the embodiment.

According to an embodiment, the material of the first light-emitting layer 20, the second light-emitting layer 30, and the third light-emitting layer 40 is selected from the group consisting of gallium nitride, aluminum indium gallium phosphide, aluminum gallium arsenide, and aluminum gallium phosphide. Nonetheless, the present invention is not limited to the embodiment.

According to an embodiment, the first dielectric layer 50, the second dielectric layer 60, and the third dielectric layer 70 are formed by the reactive-ion etching (RIE). Nonetheless, the present invention is not limited to the embodiment.

The reactive-ion etching is a processing technology for semiconductor fabrication. It uses reactive ion gas reinforced by plasma to bombard the target material and achieving the purpose of etching. The gas is generated by the electromagnetic field under a low-pressure or vacuum environment. The high-energy ions in the plasma can bombard and react with the surfaces of chips.

A typical RIE system includes a vacuum chamber with a plate at the bottom for accommodating chips. The plate is insulated from other parts of the chamber. The gas is injected from a small inlet on the top of the chamber and exhausted from the bottom to the vacuum pump. The type of the gas is determined by the etching process. For example, to etch silicon, sulfur hexafluoride will be used. By regulating the flowrate of the gas and the exhaust hole, the pressure is generally maintained at several torr to hundreds of torr. According to an embodiment, another RIE system can be adopted, for example, the inductively coupled plasma reactive-ion etching (ICP RIE). In the system, the gas will be generated by the radio-frequency (RF) magnetic field. The concentration of plasma can be very high. Unfortunately, the etching will become more isotropic. Alternatively, an RIE system formed by combining a parallel plate and the ICP RIE can be considered. In this system, the inductively coupled plasma is used to generate high-concentration plasma for accelerating the etching rate. On the other hand, an RF bias is applied independently to the chips for generating a unidirectional electric field and thus achieving the effect of anisotropy.

Figure 3:
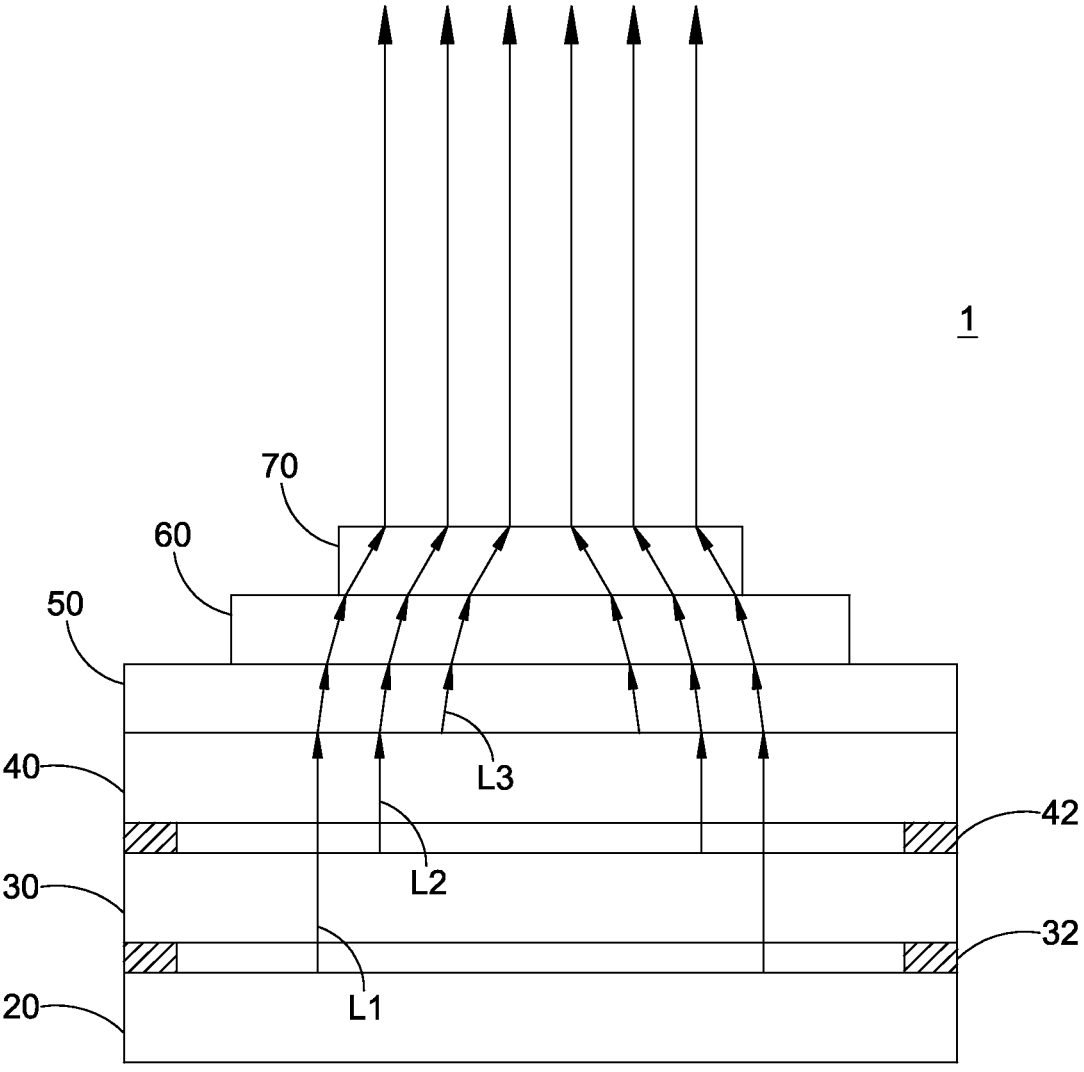
FIG. 3 shows a schematic diagram of the light path according to an embodiment of the present invention.

Please refer to FIG. 3, which shows a schematic diagram of the light path according to an embodiment of the present invention. According to the present embodiment, the first light-emitting layer 20 emits a ray of first light L1, which passes through the second light-emitting layer 30, the third light-emitting layer 40, the first dielectric layer 50, the second dielectric layer 60, and the third dielectric layer 70 sequentially and is focused. After the first light L1 is focused, it emerges from the third dielectric layer 70.

According to the present embodiment, according to the present embodiment, the second light-emitting layer 30 emits a ray of second light L2, which passes through the third light-emitting layer 40, the first dielectric layer 50, the second dielectric layer 60, and the third dielectric layer 70 sequentially and is focused. After the second light L2 is focused, it emerges from the third dielectric layer 70.

According to the present embodiment, according to the present embodiment, the third light-emitting layer 40 emits a ray of third light L3, which passes through the first dielectric layer 50, the second dielectric layer 60, and the third dielectric layer 70 sequentially and is focused. After the third light L3 is focused, it emerges from the third dielectric layer 70.

According to an embodiment, the first dielectric layer 50 and the second dielectric layer 60 emit one of the red, green, and blue light, respectively, or an arbitrary mixture of the red, green, and blue light. Nonetheless, the present invention is not limited to the embodiment.

Figure 4:
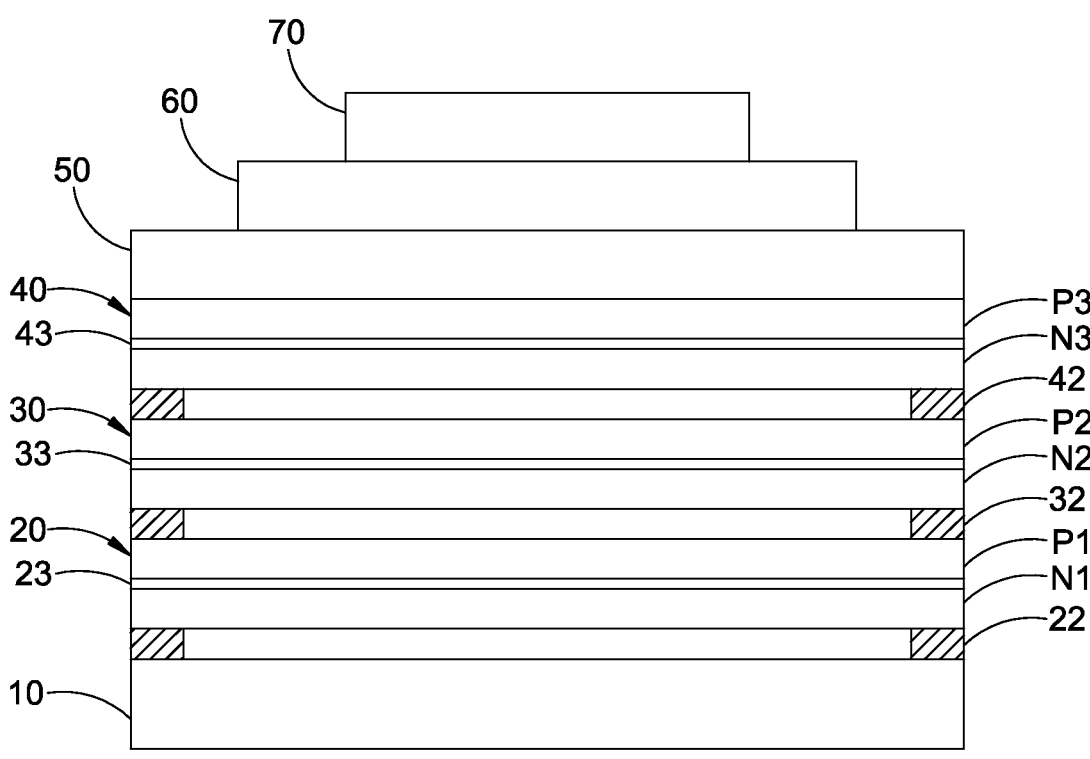
FIG. 4 shows a schematic diagram of the light-emitting layer according to an embodiment of the present invention.

Please refer to FIG. 4, which shows a schematic diagram of the light-emitting layer according to an embodiment of the present invention. As shown in the figure, the present embodiment is based on the previous one. According to the present embodiment, the micro LED structure 1 further comprises a substrate 10. The first light-emitting layer 20 is disposed on the substrate 10. A third fan-out circuit layer 22 is disposed below the first light-emitting layer 20. The third fan-out circuit layer 22 is connected electrically to the first light-emitting layer 20 and the substrate 10 so that the substrate 10, the first light-emitting layer 20, the second light-emitting layer 30, and third light-emitting layer 40 stack to one another.

The third fan-out circuit layer 22 of the first light-emitting layer 20 is identical to the first fan-out circuit layer 32 and the second fan-out circuit layer 42. The third fan-out circuit layer 22 is formed by fan-out packaging.

According to an embodiment, an air layer or an isolation layer can be disposed between the electrodes of the third fan-out circuit layer 22. Nonetheless, the present invention is not limited to the embodiment.

According to an embodiment, the material of the substrate 10 is selected from the group consisting of gallium nitride, gallium arsenide, gallium phosphide, indium phosphide, silicon carbide, and aluminum oxide. Nonetheless, the present invention is not limited to the embodiment.

Please refer to FIG. 4 again. As shown in the figure, according to the present embodiment, the first light-emitting layer 20, the second light-emitting layer 30, and third light-emitting layer 40 include an n-type semiconductor, a p-type semiconductor, and a light-emitting layer, respectively. In other words, the first light-emitting layer 20 includes an n-type semiconductor N1, a light-emitting layer 23, and a p-type semiconductor P1 stacked sequentially; the second light-emitting layer 30 includes an n-type semiconductor N2, a light-emitting layer 33, and a p-type semiconductor P2 stacked sequentially; and the third light-emitting layer 40 includes an n-type semiconductor N3, a light-emitting layer 43, and a p-type semiconductor P3 stacked sequentially. Thereby, the first light-emitting layer 20, the second light-emitting layer 30, and third light-emitting layer 40 form a light-emitting diode.

According to the present embodiment, the first light-emitting layer 20, the second light-emitting layer 30, and third light-emitting layer 40 are LEDs. The semiconductor material will be doped by impurities to form the p-n structure. Like other diodes, the current of an LED can flow from the p region (the anode) to the n region (the cathode) easily but not in the reverse direction. Two different carriers, holes and electrons, flow from the electrodes to the p-n structure under different voltages. When holes and electrons meet, they will recombine. Then the electrons will fall to lower energy levels and release energy by photons (the light). The first light-emitting layer 20, the second light-emitting layer 30, and third light-emitting layer 40 can be applied to micro LEDs, which are, but not limited to, micrometer-scale LEDs.

Figure 5:
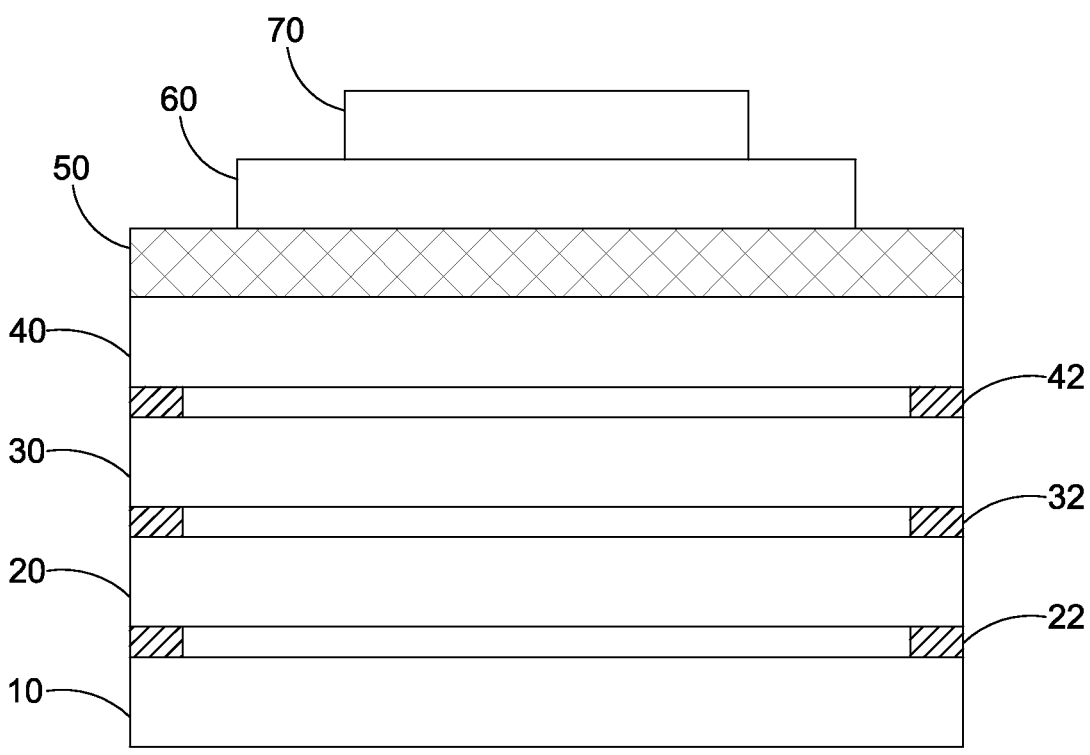
FIG. 5 shows a schematic diagram of the structure according to another embodiment of the present invention.

Please refer to FIG. 5, which shows a schematic diagram of the structure according to another embodiment of the present invention. As shown in the figure, according to the present embodiment, the first dielectric layer 50 is a grid index layer. The grid index is used to divide the space into grids for addressing more efficiently and making the micro LED 1 emit light correspondingly.

The basic concept of gid indexing is to divide the space into one or multiple square or rectangular regions. Each region is called a grid. The size of a grid is determined by the application or adjustable according to the requirements. After dividing the space into grids, each gid is given a unique index, normally an integer or a string. To inquire about data in the space, by using the index, the corresponding grid can be located rapidly. The advantages of grid indexing are simple, easy to use, and high efficiency. Wile inquiring rapidly and managing the space data, the amount of space data to be inquired can be reduced correspondingly. Accordingly, the application efficiency and performance can be improved.

In grid indexing, the most common method is two-dimensional grid indexing. This indexing can be applied to managing the space data on a plane. The grids are normally squares or rectangles. Each grid own a unique row and column number. Thereby, inquiry and management can be performed more easily.

Furthermore, there exists three-dimensional grid indexing used for managing data in a three-dimension space such as a stereoscopic model or weather information. In three-dimensional grid indexing, the grid is normally a cubic or a cuboid. Each grid own a unique address for inquiring and managing more easily. According to an embodiment, by using three-dimensional grid indexing, a plurality of micro LED structures 1 arranged in a matrix can emit light correspondingly.

Figure 6:
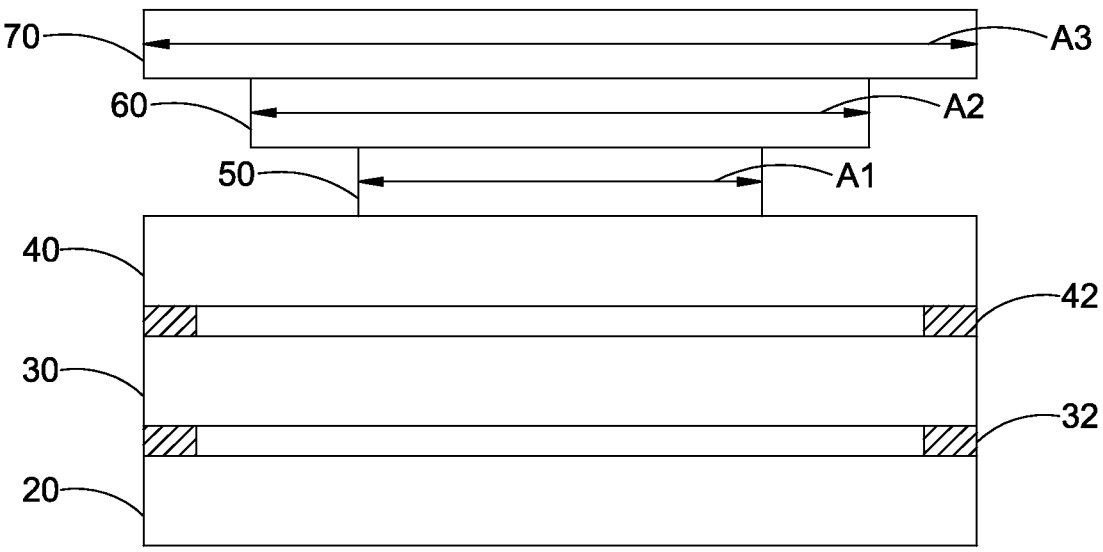
FIG. 6 shows a schematic diagram of the structure according to another embodiment of the present invention.

Please refer to FIG. 6, which shows a schematic diagram of the structure according to another embodiment of the present invention. As shown in the figure, the present embodiment is based on the structure according to the above embodiment. According to the present embodiment, a micro LED structure 1 comprises a first light-emitting layer 20, a second light-emitting layer 30, a third light-emitting layer 40, a first dielectric layer 50, a second dielectric layer 60, and a third dielectric layer 70. The layers are stacked on one another.

According to the present embodiment, the second light-emitting layer 30 is disposed on the first light-emitting layer 20. A first fan-out circuit layer 32 is disposed below the second light-emitting layer 30 and connected electrically to the first light-emitting layer 20 and the second light-emitting layer 30. The third light-emitting layer 40 is disposed on the second light-emitting layer 30. A second fan-out circuit layer 42 is disposed below the third light-emitting layer 40 and connected electrically to the second light-emitting layer 30 and the third light-emitting layer 40. The first dielectric layer 50 is disposed on the third light-emitting layer 40. The second dielectric layer 60 is disposed on the first dielectric layer 50. The third dielectric layer 70 is disposed on the second dielectric layer 60.

According to the present embodiment, the first dielectric layer 50 includes a first area A1; the second dielectric layer 60 includes a second area A2; the third dielectric layer 70 includes a third area A3. The first area A1 of the first dielectric layer 50 is smaller than the second area A2 of the second dielectric layer 60. The second area A2 of the second dielectric layer 60 is smaller than the third area A3 of the third dielectric layer 70. Thereby, the first dielectric layer 50, the second dielectric layer 60, and the third dielectric layer 70 form an inverted-trapezoidal or inverted-fan structure for focusing downwards the light emitted from the first light-emitting layer 20, the second light-emitting layer 30, and the third light-emitting layer 40 and shrinking the light-emitting angle.

According to the present embodiment, a first refractive index of the first dielectric layer 50 is greater than a second refractive index of the second dielectric layer 60. The second refractive index of the second dielectric layer 60 is greater than a third refractive index of the third dielectric layer 70. The other components of the present embodiment are the same as those described in the first embodiment. Hence, the details will not be described again.

To sum up, the present invention provides a micro LED structure formed by disposing a plurality of dielectric layers on a plurality of light-emitting layers. The areas of the dielectric layers shrink gradually from the bottom up for concentrating the light emitted from the light-emitting layers and shrinking the light-emitting angle of the micro LED stricture. Thereby, the problems of inconsistent brightness and inaccurate color due to large light-emitting angle and mixing of light from respective diode dies according to the prior art can be solved.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A micro light-emitting diode structure, comprising:
a first light-emitting layer;
a second light-emitting layer, disposed on said first light-emitting layer, a first fan-out circuit layer disposed below said second light-emitting layer and connected electrically to said first light-emitting layer and said second light-emitting layer;
a third light-emitting layer, disposed on said second light-emitting layer, a second fan-out circuit layer disposed below said third light-emitting layer and connected electrically to said second light-emitting layer and said third light-emitting layer;
a first dielectric layer, disposed on said third light-emitting layer;
a second dielectric layer, disposed on said first dielectric layer; and
a third dielectric layer, disposed on said second dielectric layer;
wherein a first area of said first dielectric layer is greater than a second area of said second dielectric layer; said second area is greater than a third area of said third dielectric layer; a first refractive index of said first dielectric layer is smaller than a second refractive index of said second dielectric layer; and said second refractive index is smaller than a third refractive index of said third dielectric layer;
wherein one of said first light-emitting layer, said second light-emitting layer, and said third light-emitting layer is configured to emit red light, one of said first light-emitting layer, said second light-emitting layer, and said third light-emitting layer is configured to emit green light, and one of said first light-emitting layer, said second light-emitting layer, and said third light-emitting layer is configured to emit blue light;
wherein light emitted from said first light-emitting layer, said second light-emitting layer, and said third light-emitting layer is incident in said first dielectric layer and passes successively through said first dielectric layer, said second dielectric layer, and said third dielectric layer; and
wherein said first dielectric layer, said second dielectric layer, and said third dielectric layer form a multilayer optical structure configured to progressively focus the incident light such that the incident light becomes more focused when passing from said first dielectric layer into said second dielectric layer and becomes further focused when passing from said second dielectric layer into said third dielectric layer.

2. The micro light-emitting diode structure of claim 1, further comprising a substrate, said first light-emitting layer disposed on said substrate, a third fan-out circuit layer disposed below said first light-emitting layer, and said third fan-out circuit layer connected electrically to said first light-emitting layer and said substrate.

3. The micro light-emitting diode structure of claim 2, wherein the material of said substrate is selected from the group consisting of gallium nitride, gallium arsenide, gallium phosphide, indium phosphide, silicon carbide, and aluminum oxide.

4. The micro light-emitting diode structure of claim 1, wherein said first dielectric layer is a grid index layer.

5. The micro light-emitting diode structure of claim 1, wherein said first dielectric layer, said second dielectric layer, and said third dielectric layer are formed by the reactive-ion etching (RIE).

6. The micro light-emitting diode structure of claim 1, wherein the material of said first light-emitting layer, said second light-emitting layer, and said third light-emitting layer is selected from the group consisting of gallium nitride, aluminum indium gallium phosphide, aluminum gallium arsenide, and aluminum gallium phosphide.

7. The micro light-emitting diode structure of claim 1, wherein said first light-emitting layer, said second light-emitting layer, and said third light-emitting layer include an n-type semiconductor and a p-type semiconductor, respectively.

8. The micro light-emitting diode structure of claim 1, wherein the energy bandgap of said first light-emitting layer is greater than the energy bandgap of said second light-emitting layer; the energy bandgap of said second light-emitting layer is greater than the energy bandgap of said third light-emitting layer.

9. The micro light-emitting diode structure of claim 1, wherein the energy bandgap of said first light-emitting layer is smaller than the energy bandgap of said second light-emitting layer; the energy bandgap of said second light-emitting layer is smaller than the energy bandgap of said third light-emitting layer.

10. A micro light-emitting diode structure, comprising:
a first light-emitting layer;
a second light-emitting layer, disposed on said first light-emitting layer, a first fan-out circuit layer disposed below said second light-emitting layer and connected electrically to said first light-emitting layer and said second light-emitting layer;
a third light-emitting layer, disposed on said second light-emitting layer, a second fan-out circuit layer disposed below said third light-emitting layer and connected electrically to said second light-emitting layer and said third light-emitting layer;
a first dielectric layer, disposed on said third light-emitting layer;
a second dielectric layer, disposed on said first dielectric layer; and
a third dielectric layer, disposed on said second dielectric layer;
wherein a first area of said first dielectric layer is smaller than a second area of said second dielectric layer; said second area is smaller than a third area of said third dielectric layer; a first refractive index of said first dielectric layer is greater than a second refractive index of said second dielectric layer; and said second refractive index is greater than a third refractive index of said third dielectric layer;
wherein one of said first light-emitting layer, said second light-emitting layer, and said third light-emitting layer is configured to emit red light, one of said first light-emitting layer, said second light-emitting layer, and said third light-emitting layer is configured to emit green light, and one of said first light-emitting layer, said second light-emitting layer, and said third light-emitting layer is configured to emit blue light;

wherein light emitted from said first light-emitting layer, said second light-emitting layer, and said third light-emitting layer is incident in said first dielectric layer and passes successively through said first dielectric layer, said second dielectric layer, and said third dielectric layer; and wherein said first dielectric layer, said second dielectric layer, and said third dielectric layer form a multilayer optical structure configured to progressively focus the incident light such that the incident light becomes more focused when passing from said first dielectric layer into said second dielectric layer and becomes further focused when passing from said second dielectric layer into said third dielectric layer.

\* \* \* \* \*